US 6,731,663 B1

(12) United States Patent
Kasukawa et al.

(10) Patent No.: US 6,731,663 B1
(45) Date of Patent: *May 4, 2004

(54) RIDGE WAVEGUIDE TYPE SEMICONDUCTOR LASER DEVICE

(75) Inventors: Akihiko Kasukawa, Tokyo (JP); Takeshi Namegaya, Yokohama (JP)

(73) Assignee: The Furukawa Electric Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/536,609

(22) Filed: Mar. 28, 2000

(51) Int. Cl.[7] .................................................. H01S 5/00
(52) U.S. Cl. ............................................ 372/45; 372/46
(58) Field of Search ..................................... 372/43–46

(56) References Cited

U.S. PATENT DOCUMENTS

| | | | | |
|---|---|---|---|---|
| 4,961,197 A | * | 10/1990 | Tanaka et al. | 372/45 |
| 5,394,424 A | | 2/1995 | Ijichi et al. | |
| 5,502,741 A | * | 3/1996 | Carroll et al. | 372/96 |
| 5,511,088 A | * | 4/1996 | Loualiche et al. | 372/45 |
| 5,696,784 A | * | 12/1997 | Srinivasan et al. | 372/46 |
| 5,757,837 A | * | 5/1998 | Lim et al. | 372/45 |
| 5,920,586 A | * | 7/1999 | Nagai | 372/46 |
| 5,936,994 A | * | 8/1999 | Hong et al. | 372/46 |
| 5,956,359 A | * | 9/1999 | Adams et al. | 372/45 |
| 5,960,020 A | * | 9/1999 | Nagai | 372/46 |
| 5,982,531 A | * | 11/1999 | Emery et al. | 372/43 |
| 5,987,047 A | * | 11/1999 | Valster et al. | 372/45 |
| 5,990,496 A | * | 11/1999 | Kunisato et al. | 257/94 |
| 6,044,098 A | * | 3/2000 | Sun | 372/46 |
| 6,075,802 A | * | 6/2000 | Stolz et al. | 372/46 |
| 6,195,380 B1 | * | 2/2001 | Shih et al. | 372/46 |
| 6,256,330 B1 | * | 7/2001 | LaComb | 372/46 |
| 6,314,122 B1 | * | 11/2001 | Peale | 372/45 |
| 6,370,176 B1 | * | 4/2002 | Okumura | 372/45 |
| 6,373,875 B1 | * | 4/2002 | Yu et al. | 372/46 |

OTHER PUBLICATIONS

H. Jaeckel, et al., IEEE Journal of Quantum Electronics, vol. 27, No. 6, pp. 1560 to 1567, Very High–Power (425 mW) AlGaAs SQW–Grinsch Ridge Laser with Frequency–Doubled Output (41 mW at 428 nm), Jun. 1991.

* cited by examiner

Primary Examiner—Paul Ip
Assistant Examiner—James Menefee
(74) Attorney, Agent, or Firm—Oblon, Spivak, McClelland, Maier & Neustadt, P.C.

(57) ABSTRACT

Provided is a ridge waveguide type semiconductor laser device in which fundamental transverse mode operation is stabilized and unstable jumps of a longitudinal mode (oscillation wavelength) never occur even with use of high optical output of 300 mW or more. The semiconductor laser device has a stacked structure composed of a substrate and layers thereon. The layers include a lower cladding layer, lower optical confinement layer, active layer, upper optical confinement layer, and upper cladding layer, which are built up in the order named. A ridge is formed on the upper cladding layer. The width (W) of the bottom ridge portion of the ridge ranges from 2.5 μm to 5.0 μm, and the distance from the bottom ridge portion to an active layer is adjusted to a value higher than 0.5 μm and not higher than 0.8 μm.

8 Claims, 4 Drawing Sheets

RIDGE WAVEGUIDE TYPE SEMICONDUCTOR LASER DEVICE

BACKGROUND OF THE INVENTION

1. Field of the Invention

The present invention relates to a ridge waveguide type semiconductor laser device, and more specifically, to a ridge waveguide type semiconductor laser device capable of maintaining stable fundamental transverse mode operation without involving any jumps of a longitudinal oscillation mode, even with use of high optical output of 300 mW or more.

2. Prior Art

A semiconductor laser device that is built up on a GaAs substrate and oscillates in a 980-nm band can be effectively used as a pumping laser device for an Er-doped fiber amplifier (EDFA). An optical output at the output end of an Er-doped fiber that is coupled to this laser device is expected to be at a value near 100 mW.

If the efficiency of coupling between the Er-doped fiber and the laser device is 60%, realization of the aforesaid fiber end output requires the optical output of a laser beam from the laser device to be at 170 mW or thereabout.

If a semiconductor laser device is used as the laser device, moreover, it is expected to perform stable fundamental transverse mode oscillation in order to ensure satisfactory efficiency of coupling between the laser device and a single-mode fiber. If the semiconductor laser device undergoes high-order mode oscillation, its optical output increases. In this case, however, the coupling efficiency of the laser beam and the single-mode fiber worsens extremely, so that the optical output at the output end of the fiber lowers.

Thus, if the semiconductor laser device that is coupled to the fiber is injected with current to be actuated, the upper limit of the injected current level at which the laser device can maintain the fundamental transverse mode operation is an important problem in increasing the optical output at the output end of the fiber.

In general, a ridge waveguide type semiconductor laser device is used as the semiconductor laser device that oscillates in the 980-nm band. In this laser device, AlGaAs is used as the material of its cladding layers and the top portion of its upper cladding layer is formed as a ridge waveguide to ensure high operation reliability.

For the ridge waveguide type semiconductor laser device constructed in this manner, theoretical calculations for necessary conditions for the fundamental transverse mode operation of the laser device have been published (H. Jaeckel et al., IEEE J. Quantum Electron, vol. 27, No. 6, pp. 1,560–1,567, 1991).

Proposed in the above report is a ridge waveguide type semiconductor laser device of the layer structure shown in FIG. 1. This device has a stacked structure that is composed of a substrate 1 of n-GaAs and several layers formed thereon through the buffer layer. These layers include a lower cladding layer 2 of n-$Al_{0.3}Ga_{0.7}As$, a lower optical confinement layer 3 of n-AlGaAs, an active layer 4 of a strain type quantum well structure, formed of InGaAs/GaAs, an upper optical confinement layer 5 of p-AlGaAs, and an upper cladding layer 6 of p-$Al_{0.3}Ga_{0.7}As$, which are built up in the order named. The top portion of the upper cladding layer 6 constitutes a ridge waveguide 7, and a contact layer 8 of p-GaAs is formed on the top surface of the waveguide 7. The other portion of the upper cladding layer 6 is covered with an insulating protective film 9 of $Si_3N_4$. An upper electrode 10 of Ti—Pt—Au is formed on the top surface of the protective film 9, and a lower electrode 11 of Ge—Au—Ni is formed on the back surface of the substrate 1.

In obtaining the necessary conditions for the fundamental transverse mode operation of the semiconductor laser device, according to the aforementioned report, the aforesaid stacked structure is converted into a layer structure model in which the active layer 4 is interposed between the AlGaAs layers, as shown in FIG. 2. The relation between the width (W) of a base portion 7a of the ridge waveguide 7 and the distance (t) from the bottom ridge portion 7a to the active layer 4 is theoretically calculated for the case where the structure model shows fundamental transverse mode oscillation in the relationship between the single mode fiber. FIG. 3 shows the result of the calculation.

According to the aforementioned report, the obtained semiconductor laser device can perform the fundamental transverse mode operation under any conditions if the width (W) of the base portion 7a of the ridge to be formed and the distance (t) from the bottom ridge portion 7a to the active layer 4 are adjusted individually to values that fulfill a hatched region $S_0$ in FIG. 3, in manufacturing the ridge waveguide type semiconductor laser device.

In the case of the ridge waveguide type semiconductor laser device designed in accordance with the aforesaid theoretical calculations, the fundamental transverse mode operation can be realized with high yield if the optical output of the laser beam ranges from 200 to 250 mW.

If the injected current is increased to obtain a higher optical output, however, it is hard to maintain stable fundamental transverse mode operation, and the oscillation wavelength starts unstable behavior in response to the instability of the transverse mode.

In the case of a semiconductor laser device that was manufactured with the width (W) of the bottom ridge portion 7a at 3.2 μm and the distance (t) from the bottom ridge portion 7a to the active layer at 0.3 μm, according to an experiment conducted by the inventors hereof, for example, the fundamental transverse mode operation was kept stable without involving any jumps of the longitudinal mode (oscillation wavelength) when the injected current was not higher than about 280 mA (about 250 mW in terms of optical output). When the injected current was made higher, however, the fundamental transverse mode operation became unstable.

Thus, it was ascertained that a ridge waveguide type semiconductor laser device that oscillates in the 980-nm band, which requires high optical output, could not be designed in accordance with a W-t relational diagram that appears in the aforementioned report.

OBJECT AND SUMMARY OF THE INVENTION

The object of the present invention is to provide a novel ridge waveguide type semiconductor laser device, which can solve the aforementioned problems of the conventional ridge waveguide type semiconductor laser device, and in which design parameters of a ridge waveguide are set in the following manner so that fundamental transverse mode operation can be maintained even with use of high optical output of 300 mW or more, and the longitudinal mode (oscillation wavelength) is restrained from jumping.

In order to achieve the above object, the inventors hereof varied the width (W) of a bottom ridge portion of a ridge waveguide type semiconductor laser device to be formed and the distance (t) from the bottom ridge portion to an active layer, and measured kink current for each case to examine the stability of fundamental transverse mode operation. In consequence, it was newly found that if a ridge waveguide is designed with values W and t (mentioned later) in a region off the hatched region $S_0$ in FIG. 3 in the aforementioned report, the kink current in the semiconductor laser device is as high as about 400 mA, and the longitudinal mode (oscillation wavelength) can be stabilized.

Based on this knowledge, the inventors hereof further studied and developed a ridge waveguide type semiconductor laser device of the present invention.

Thus, according to the present invention, there is provided a ridge waveguide type semiconductor laser device comprising a stacked structure composed of a substrate and layers thereon, including a lower cladding layer, lower optical confinement layer, active layer, upper optical confinement layer, and upper cladding layer built up in the order named, the upper cladding layer having an upper part in the shape of a ridge and a lower part situated on the active layer, and the width of the bottom ridge portion of the ridge ranging from 2.5 μm to 5.0 μm and the distance from the bottom ridge to the active layer being adjusted to a value higher than 0.5 μm and not higher than 0.8 μm.

DETAILED DESCRIPTION OF THE INVENTION

Figure 4:
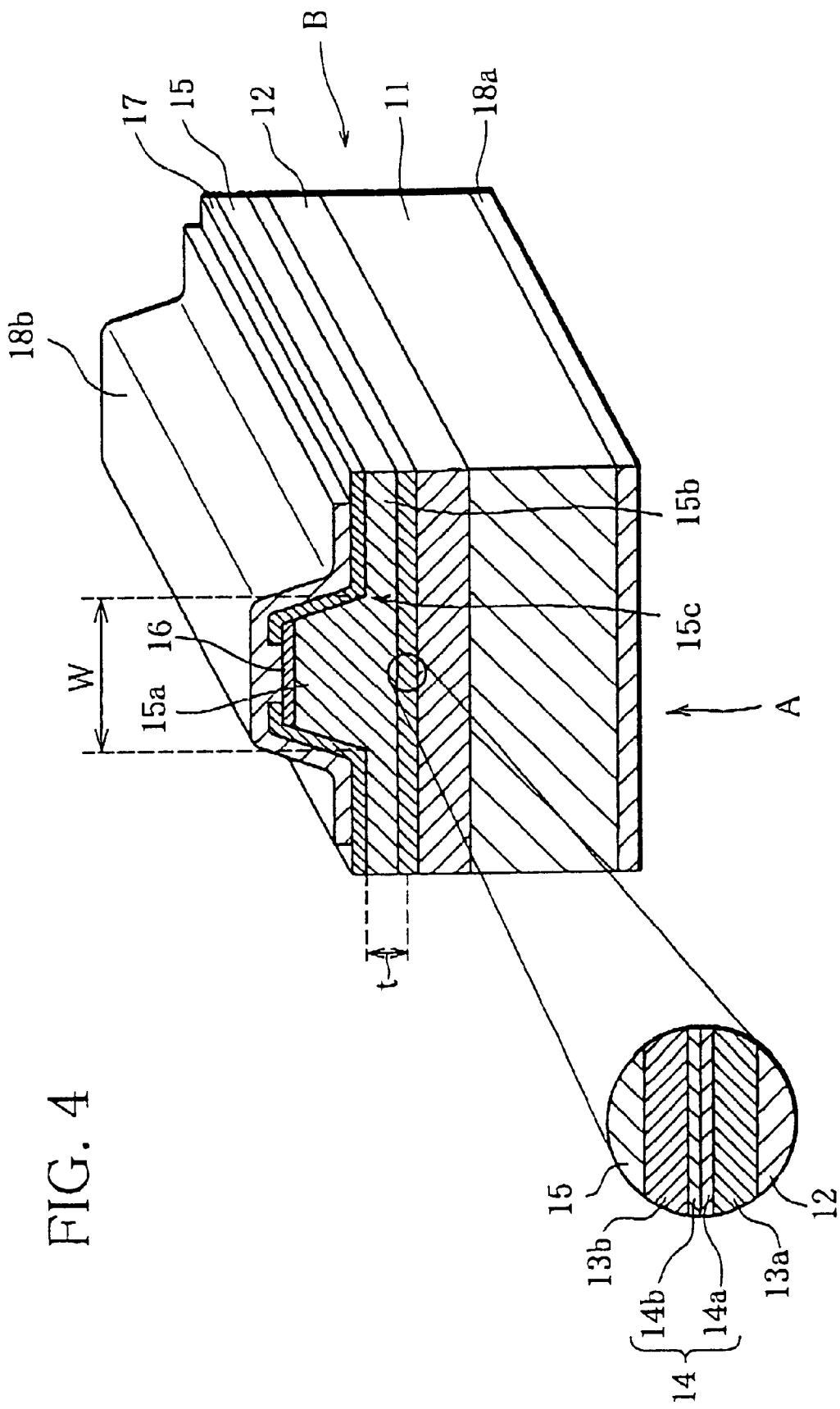
FIG. 4 is a perspective view showing a semiconductor laser device according to the present invention.

FIG. 4 shows an example of a laser device of the present invention.

This laser device has a stacked structure that is composed of a substrate 11 of, e.g., n-GaAs and several layers formed thereon. These layers include a lower cladding layer 12 of, e.g., n-AlGaAs, a lower optical confinement layer 13a of, e.g., i-AlGaAs, an active layer 14 of a double-strain quantum well structure, formed of, e.g., an InGaAs quantum well layer 14a and a GaAsP quantum well layer 14b, an upper optical confinement layer 13b of, e.g., i-AlGaAs, and an upper cladding layer 15 of, e.g., p-AlGaAs, which are built up in the order named.

Although the active layer 14 shown in FIG. 4 is formed of the two quantum well layers, the layer structure of the active layer is not limited to this arrangement, and the active layer may be formed by building up a single quantum well or a larger number of quantum well layers.

A ridge 15a (mentioned later) is stacked on the upper part of the upper cladding layer 15, and a contact layer 16 of, e.g., p-GaAs is stacked on the top surface of the ridge 15a. The side faces of the top ridge 15a and the surface of a lower part 15b of the upper cladding layer 15 are covered with an insulating protective film 17 of, e.g., silicon nitride. The film 17 is loaded with an upper electrode 18b of, e.g., Ti—Pt—Au that is in contact with the contact layer 16, and the back surface of the substrate 11 is loaded with a lower electrode 18a of, e.g., Ge—Au—Ni.

An emission end face A, which is coupled to a fiber (not shown), is covered with a low-reflection film (not shown) of, e.g., $Al_2O_3$, and a face B on the opposite side is covered with a high-reflection film (not shown) that is formed of a multi-layer film of, e.g., SiO/Si.

This laser device can be formed in the following manner.

First, the lower cladding layer 12, lower optical confinement layer 13a, active layer 14 that is composed of the layers 14a and 14b, upper optical confinement layer 13b, upper cladding layer 15, and contact layer 16 are built up on the substrate 11 by, e.g., the MOCVD method, in the order named. The conventional photolithography and etching technique are applied to the resulting stacked structure. Thus, the upper cladding layer 15 is removed halfway by etching, whereupon the ridge waveguide 15a is formed.

As the upper cladding layer 15 is etched in this manner, the width (ridge width W) of a bottom ridge portion 15c of the ridge 15a to be formed and a distance t from the bottom ridge portion 15c to the active layer 14 is adjusted to the values mentioned later.

After the insulating protective film 17 of silicon nitride is then formed on the whole surface of the upper cladding layer 15 having the ridge 15a thereon by, e.g., the plasma CVD method, part of the insulating protective film 17 on the top surface of the ridge 15a is removed by etching, whereby the contact layer 16 is exposed there. Then, the upper electrode 18b is formed there by, e.g., vacuum deposition method, and moreover, the lower electrode 18a is formed on the back surface of the substrate 11.

Thereafter, the whole structure is cleaved to the cavity length, and low- and high-reflection films are formed on two exposed cleaved surfaces, individually, whereupon the intended laser device is obtained.

The width (W) of the bottom ridge portion 5c is adjusted to a value wider than 2.5 μm and not wider than 5.0 μm, and the distance (t) from the bottom ridge portion 5c to the active layer 14 is also adjusted to a value higher than 0.5 μm and not higher than 0.8 μm.

Figure 1:
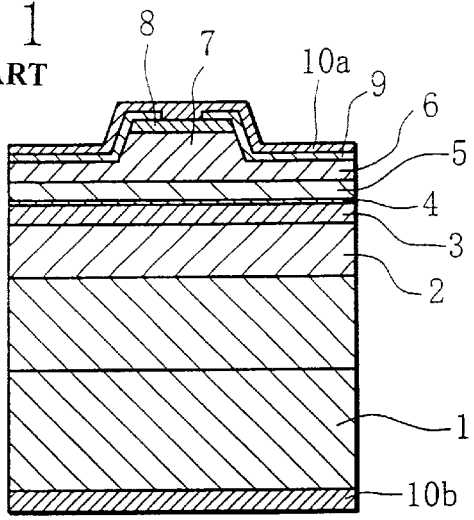
FIG. 1 is a sectional view showing an example of the profile of a conventional ridge waveguide type semiconductor laser device.
Figure 2:
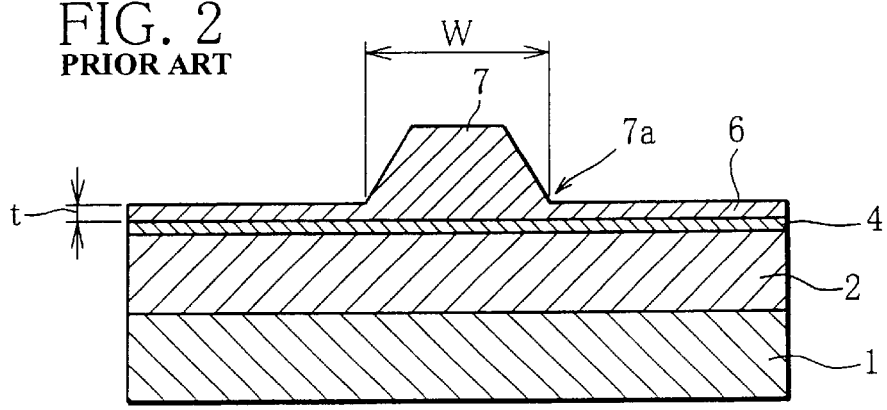
FIG. 2 is a sectional view showing a layer structure model used in theoretically calculating the stability of fundamental transverse mode operation of the semiconductor laser device of FIG. 1.
Figure 3:
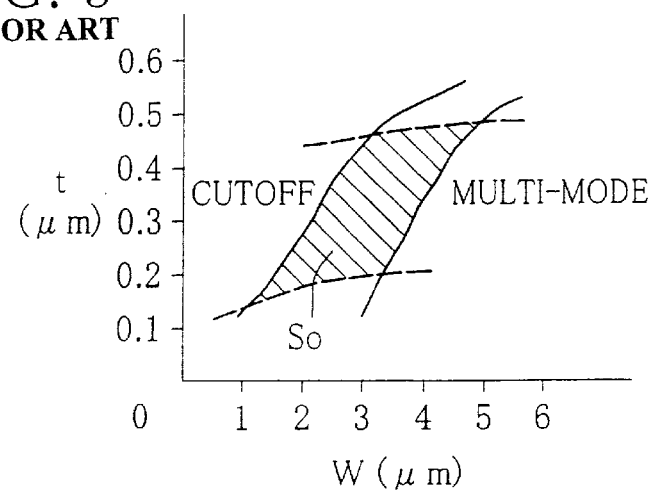
FIG. 3 is a graph showing the relation between the ridge width (W) and the distance (t) from a bottom ridge portion to an active layer with which the fundamental transverse mode operation is stabilized in the model layer structure of FIG. 2.
Figure 5:
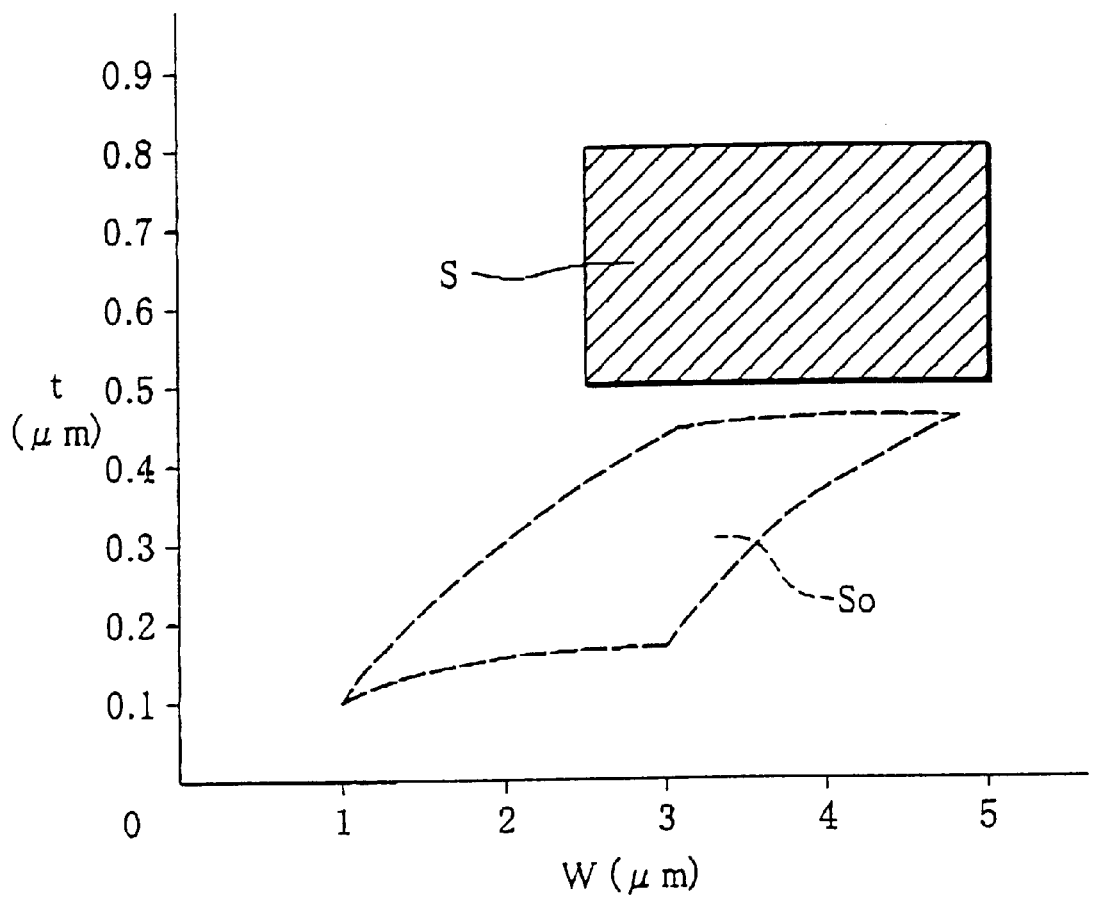
FIG. 5 is a graph showing the relation between the width (W) of a bottom ridge portion and the distance (t) from the bottom ridge portion to an active layer with which fundamental transverse mode operation is stabilized.

Thus, W and t are set as values for coordinate points in a hatched region S shown in FIG. 5. A region $S_0$ surrounded by broken line in FIG. 5 is a region that fulfills the conditions for W and t in which the conventional fundamental transverse mode oscillation shown in FIG. 3 can be stabilized.

The lower limit value of the width (W) of the bottom ridge portion 15c is adjusted to 2.5 μm because if the width is narrower, the width of the top portion of the ridge 15a that is formed in the process of etching is narrower than 1 μm, so that ridge 15a cannot be easily formed with stability, thus failing to ensure practical design and dimensions.

If the width of the bottom ridge portion 15c is wider than 5 μm, the transverse extent of injected current is so wide that the threshold current increases, the efficiency lowers, and a high-order transverse mode is allowed.

If the value t is adjusted to 0.5 μm or less, moreover, kink current becomes too low to ensure the stability of the fundamental transverse mode operation for high-output oscillation. If the value t is adjusted to a value higher than 0.8 μm, the kink current increases to about 400 mA with the cavity length at 800 μm. However, the injected current spreads in the transverse direction, the threshold current increases, and the efficiency lowers. Further, unstable jumps of the longitudinal mode (oscillation wavelength) start to occur, so that the oscillation wavelength becomes unstable.

If the ridge 15a is thus formed with the values W and t that fulfill the region S of FIG. 5, the kink current of the laser device with the cavity length of 800 μm is about 400 mA, so that the fundamental transverse mode operation is stabilized, and the jumps of the longitudinal mode (oscillation wavelength) cease to occur.

The absolute value of the kink current can be increased by extending the cavity length. Even in this case, however, the value t should preferably be adjusted to a value higher than 0.5 μm and not higher than 0.8 μm for the same reason.

Figure 6:
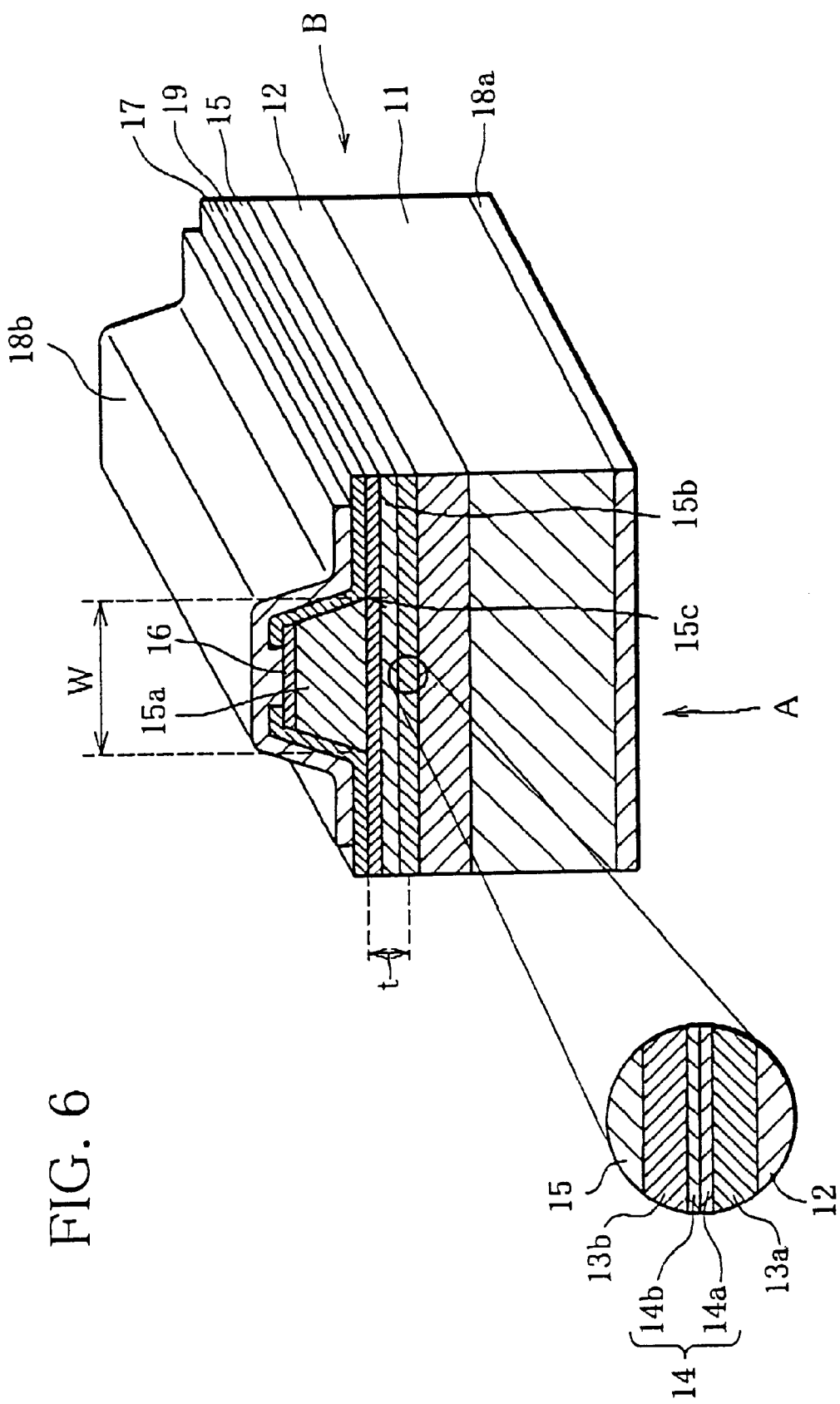
FIG. 6 is a perspective view showing another semiconductor laser device according to the invention.

Preferably, in the laser device of the present invention, an etching stop layer 19 of, e.g., InGaP should be formed in the upper cladding layer 15, as shown in FIG. 6, in order to control the value t accurately.

In the process of forming the upper optical confinement layer 13b and the upper cladding layer 15 thereon, the upper cladding layer is formed again after the etching stop layer 19 with a desired thickness is temporarily formed, and moreover, the contact layer 16 is formed to complete the stacked structure.

As this is done, film forming conditions are controlled so that the distance from the etching stop layer 19 to the active layer 14 can be accurately adjusted to the target value t.

The resulting stacked structure is etched. Since etching of the upper cladding layer 15 securely stops at the location of the etching stop layer 19 and never advances further, so that the target value t can be obtained accurately.

Embodiment

The laser device shown in FIG. 6 was manufactured in the following manner.

First, the lower cladding layer 12 of n-$Al_{0.3}Ga_{0.7}As$ with a thickness of 2 μm, lower optical confinement layer 13a of i-$Al_{0.2}Ga_{0.8}As$ with a thickness of 100 nm, double-strain quantum well active layer 14 including the strain quantum well layer 14a (7 nm) of InGaAs and the quantum well layer (10 nm) 14b of GaAsP, and upper optical confinement layer 13b of i-$Al_{0.2}Ga_{0.8}As$ with a thickness of 100 nm were formed on the n-GaAs substrate 11.

Then, p-$Al_{0.3}Ga_{0.7}As$ was formed on the upper optical confinement layer 13b. When the resulting film thickness reached 0.5 μm, the etching stop layer 19 of p-InGaP with a thickness of 2.5 nm was formed on the resulting film, and p-$Al_{0.3}Ga_{0.7}As$ was formed again on the resulting structure, whereupon the upper cladding layer 15 with an overall thickness of 2 μm was obtained. The contact layer 16 of p-GaAs with a thickness of 0.5 μm was formed on the layer 15, whereupon the stacked structure was formed entire.

Then, the stacked structure was subjected to photolithography and wet etching to form the ridge 15a. The width (W) of the bottom ridge portion 15c was 4 μm, and the distance (t) from the bottom ridge portion 15c to the active layer 14 was about 0.6 μm.

Thereafter, the ridge 15a and the etching stop layer 19 were covered with the insulating protective film 17 of Si, N, the contact layer 16 was loaded with the upper electrode 18b of Ti—Pt—Au, and the back surface of the substrate 11 was loaded with the lower electrode 18a of Ge—Au—Ni. Then, the resulting structure was cleaved to the cavity length of 800 μm. A low-reflection film of 5% reflectance was formed on a light emission end face, out of the resulting cleaved surfaces, and a high-reflection film of 92% reflectance was formed on the opposite cleaved surface, whereupon the laser device was completed.

The threshold current and quantum efficiency of the laser device were 28 mA and 0.95 W/A, respectively. When the injected current was not higher than 400 mA (about 350 mW in terms of optical output), stable fundamental transverse mode operation was performed, and the oscillation wavelength was stabilized without any unstable jumps of the longitudinal mode.

Laser devices with various ridge shapes were manufactured varying the values W and t, and the injected current was changed. The state of fundamental transverse mode operation was examined. As long as the values W and t were values in the region S of FIG. 5, in any cases, stable fundamental transverse mode operation was obtained with the injected current of about 400 mA or less without involving any unstable jumps of the longitudinal mode (oscillation wavelength).

Although a 980-nm band semiconductor laser device with an active layer of InGaAs/GaAsP has been described herein as the laser device according to the embodiment, manufacturing conditions for the semiconductor laser device of the present invention are also applicable to GaAs-based devices of 680 to 850 nm bands.

In the ridge waveguide type semiconductor laser device of the present invention, as is evident from the above description, the fundamental transverse mode operation is stabilized and unstable jumps of the longitudinal mode (oscillation wavelength) never occur even with use of high optical output of 300 mW or more.

This is an effect that can be obtained when the width (W) of the bottom ridge portion and the distance (t) from the bottom ridge portion to the active layer are adjusted to 2.5 to 5.0 μm and a value higher than 0.5 μm and not higher than 0.8 μm, respectively, although it is not in accordance with the conventional technical common sense related to ridge formation.

What is claimed is:

1. A ridge waveguide type semiconductor laser device comprising:
   a stacked structure composed of a substrate and layers thereon, including a lower cladding layer, lower optical confinement layer, active layer, upper optical confinement layer, and upper cladding layer built up in the order named,
   the upper cladding layer having an upper part in the shape of a ridge and a lower part situated on the upper optical confinement layer, wherein said upper part is not in contact with a semiconductor absorbing layer, and
   the width of the bottom ridge portion of the ridge ranging from 2.5 μm to 5.0 μm and the distance from the bottom ridge portion to the active layer being adjusted to a value higher than 0.5 μm and not higher than 0.8 μm, said width and distance ranges providing stable fundamental transverse mode operation at power levels above 250 mW.

2. The ridge waveguide type semiconductor laser device according to claim 1, wherein the said active layer has a multi-quantum well structure containing well-layers of InGaAs.

3. The ridge waveguide type semiconductor laser device according to claim 1, wherein the said semiconductor laser device oscillates at a wavelength that is longer than or equal to 0.9 μm.

4. The ridge waveguide type semiconductor laser device according to claim 1, wherein said upper cladding layer has an etching stop layer formed therein.

5. The ridge waveguide type semiconductor laser device according to claim 4, wherein the said active layer has a multi-quantum well structure containing well-layers of InGaAs.

6. The ridge waveguide type semiconductor laser device according to claim 4, wherein the said semiconductor laser device oscillates at a wavelength that is longer than or equal to 0.9 $\mu$m.

7. A pumping source for an optical amplifier, comprising:
a ridge waveguide type semiconductor laser device comprising:
a stacked structure composed of a substrate and layers thereon, including a lower cladding layer, lower optical confinement layer, active layer, upper optical confinement layer, and upper cladding layer built up in the order named,
the upper cladding layer having an upper part in the shape of a ridge and a lower part situated on the upper optical confinement layer, wherein said upper part is not in contact with a semiconductor absorbing layer, and
the width of the bottom ridge portion of the ridge ranging from 2.5 $\mu$m to 5.0 $\mu$m and the distance from the bottom ridge portion to the active layer being adjusted to a value higher than 0.5 $\mu$m and not higher than 0.8 $\mu$m, said width and distance ranges providing stable fundamental transverse mode operation at power levels above 250 mW, and
an optical fiber coupled to said ridge waveguide type semiconductor device and configured to transmit a light output of the device to an output end of the optical fiber.

8. A pumping source for an optical amplifier, comprising:
a ridge waveguide type semiconductor laser device comprising:
a stacked structure composed of a substrate and layers thereon, including a lower cladding layer, lower optical confinement layer, active layer, upper optical confinement layer, and upper cladding layer built up in the order named,
the upper cladding layer having an upper part in the shape of a ridge and a lower part situated on the upper optical confinement layer, wherein said upper part is not in contact with a semiconductor absorbing layer, and
the width of the bottom ridge portion of the ridge ranging from 2.5 $\mu$m to 5.0 $\mu$m and the distance from the bottom ridge portion to the active layer being adjusted to a value higher than 0.5 $\mu$m and not higher than 0.8 $\mu$m, said width and distance ranges providing stable fundamental transverse mode operation at power levels above 250 mW, and
an optical fiber coupled to said ridge waveguide type semiconductor device and configured to transmit a light output of the device to an output end of the optical fiber, wherein said upper cladding layer has an etching stop layer formed therein.

* * * * *